001

United States Patent
Sakamoto

(10) Patent No.: US 8,813,678 B2
(45) Date of Patent: *Aug. 26, 2014

(54) SUBSTRATE PROCESSING APPARATUS

(75) Inventor: Kazuo Sakamoto, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 74 days.

This patent is subject to a terminal disclaimer.

(21) Appl. No.: 13/586,437

(22) Filed: Aug. 15, 2012

(65) Prior Publication Data

US 2012/0304920 A1 Dec. 6, 2012

Related U.S. Application Data

(62) Division of application No. 12/166,492, filed on Jul. 2, 2008, now Pat. No. 8,267,037.

(30) Foreign Application Priority Data

Jul. 9, 2007 (JP) ................................. 2007-179582

(51) Int. Cl.
*B05C 5/02* (2006.01)
*G03F 7/16* (2006.01)
*H01L 21/027* (2006.01)
*B05C 11/08* (2006.01)

(52) U.S. Cl.
CPC ............. *G03F 7/162* (2013.01); *H01L 21/0276* (2013.01); *B05C 5/0208* (2013.01); *B05C 11/08* (2013.01)
USPC .................. 118/66; 118/52; 118/56; 118/319; 118/320; 118/500; 118/50; 396/611

(58) Field of Classification Search
CPC .... H01L 21/0276; B05C 5/02; B05C 5/0208; B05C 11/08; G03F 7/162
USPC ................ 118/66, 52, 56, 319, 320, 500, 50; 427/240; 396/604, 611, 627; 134/902
See application file for complete search history.

(56) References Cited

U.S. PATENT DOCUMENTS 5,200,017 A    4/1993   Kawasaki et al.
6,428,852 B1    8/2002   Pillion et al.
(Continued)

FOREIGN PATENT DOCUMENTS

EP       1770762    *   4/2007           H01L 21/00
JP       3-245870       11/1991
(Continued)

OTHER PUBLICATIONS

Office Action issued Jul. 28, 2011, in Japanese Patent Application No. 2007-179582 (with English-language translation).

*Primary Examiner* — Laura Edwards
(74) *Attorney, Agent, or Firm* — Oblon, Spivak, McClelland, Maier & Neustadt, L.L.P.

(57) ABSTRACT

A substrate processing apparatus including a holder for rotatably holding a substrate; a coating solution supply nozzle for supplying a coating solution onto a front surface of the substrate to be processed held by the holder; a treatment chamber housing the holder and the coating solution supply nozzle; a cooling device which cools the substrate before the coating solution is supplied to the substrate, to a predetermined temperature; a heating devices which heats the substrate coated with the coating solution to a predetermined temperature; and a transferer that transfers the substrate between the treatment chamber, the cooling device and the heating device, wherein the treatment chamber, the cooling device and the heating device are partitioned from ambient air, and wherein at least the treatment chamber is connected to a gas supply mechanism having a supply source of a gas having a kinematic viscosity coefficient higher than that of air.

9 Claims, 9 Drawing Sheets

(56) References Cited

U.S. PATENT DOCUMENTS

| | | |
|---|---|---|
| 8,267,037 B2 * | 9/2012 | Sakamoto ..................... 118/66 |
| 2003/0213431 A1 * | 11/2003 | Fukutomi et al. ............. 118/696 |
| 2004/0050321 A1 | 3/2004 | Kitano et al. |
| 2004/0161548 A1 | 8/2004 | Nagashima et al. |
| 2006/0134340 A1 * | 6/2006 | Ishikawa et al. ........... 427/421.1 |
| 2006/0201423 A1 * | 9/2006 | Akimoto et al. .............. 118/712 |

FOREIGN PATENT DOCUMENTS

| | | |
|---|---|---|
| JP | 5-283331 | 10/1993 |
| JP | 9-213621 | 8/1997 |
| JP | 10-74688 | 3/1998 |
| JP | 2001-176784 | 6/2001 |
| JP | 2002-118051 | 4/2002 |
| JP | 2003-164785 | 6/2003 |

* cited by examiner

SUBSTRATE PROCESSING APPARATUS

CROSS-REFERENCE TO RELATED APPLICATIONS

This application is a divisional application of and claims the benefit of priority from U.S. Ser. No. 12/166,492, filed Jul. 2, 2008, now U.S. Pat. No. 8,267,037. the entire contents of this application is incorporated herein by reference. U.S. Ser. No. 12/166,492 claims the benefit of priority from Japanese Patent Application No. 2007-179582, filed Jul. 9, 2007.

BACKGROUND OF THE INVENTION

1. Field of the Invention

The present invention relates to a substrate processing apparatus for applying a coating solution to a substrate such as a semiconductor wafer, an LCD glass substrate and so on and processing it.

2. Description of the Related Art

Generally, the photolithography technique in manufacturing process of a semiconductor device is performed by a series of processes such that a resist solution that is a coating solution is applied to the front surface of a substrate, such as a semiconductor wafer (hereinafter, referred to as a wafer), a resist film formed by the application of the solution is exposed to light according to a predetermined circuit pattern, and the exposed pattern is subjected to developing treatment to form a desired circuit pattern in the resist film.

In the above-described resist coating treatment, a spin chuck being a holding means rotatably holds a wafer, and the resist solution is supplied to the center of the front surface of the rotated wafer so that the resist solution on the wafer is spread by a centrifugal force by the rotation, whereby a uniform resist film is formed on the front surface of the wafer.

However, a problem with, in particular, a large-sized wafer (for example, a wafer having a size of 300 mm or larger) is that when the number of rotations is increased, the circumferential speed is increased and accordingly the resist solution dries more faster due to evaporation of a solvent to make the film thickness at the outer peripheral portion thicker, resulting in nonuniform film thickness.

As means to solve the above problem, a coating technique is known in which a gas having a kinematic viscosity coefficient higher than that of air, for example, helium (He) gas is supplied to a treatment space in which the resist solution is supplied to the rotated wafer so as to reduce a variations in uniformity of the film thickness at the wafer outer periphery (Claims in Japanese Patent Application Laid-open No. 3-245870).

Another method (apparatus) is also known in which the resist coating treatment is performed in a state in which an inert gas, for example, nitrogen ($N_2$) gas, helium (He) gas or the like is introduced into the resist coating chamber to bring the pressure in the resist coating chamber to be higher than the atmospheric pressure, or into a positive pressure (Claims and FIG. 1 in Japanese Patent Application Laid-open No. 10-74688, and Claims and FIG. 4 in Japanese Patent Application Laid-open No. 2002-118051).

SUMMARY OF THE INVENTION

However, in the techniques described in these conventional documents, a means for keeping the inside of the resist treatment space at an optimal gas concentration is not referred to, but it is necessary to bring the inside of the resist treatment space to an optimal gas concentration. In this case, if much time is required to bring the inside of the resist treatment space to an optimal gas concentration, the throughput is reduced because the treatment cannot be performed during the time. Beside, unstable gas concentration causes a failure to make uniform the coating film thickness. Further, in the techniques described in Japanese Patent Application Laid-open No. 10-74688 and Japanese Patent Application Laid-open No. 2002-118051, a pressure difference can occur between the ambient air and the treatment space due to the inside of the resist treatment space brought to higher (positive) in pressure than the ambient air to cause an air turbulence, resulting in nonuniform coating film thickness.

The present invention has been developed in consideration of the above circumstances, and its object is to increase the throughput and improve the uniformity in coating film thickness.

A substrate processing apparatus of the present invention includes a holding means for rotatably holding a substrate to be processed; a coating solution supply nozzle for supplying a coating solution onto a front surface of the substrate to be processed held by the holding means; a treatment chamber housing the holding means and the coating solution supply nozzle; a cooling means for cooling the substrate to be processed before the coating solution is supplied to the substrate to be processed, to a predetermined temperature; a heating means for heating the substrate to be processed coated with the coating solution to a predetermined temperature; and a transfer means for transferring the substrate to be processed between the treatment chamber, the cooling means and the heating means. The treatment chamber, the cooling means and the heating means are partitioned from an ambient air, and at least the treatment chamber is connected to a gas supply mechanism having a supply source of a gas having a kinematic viscosity coefficient higher than that of air and kept at a predetermined concentration of the gas.

According to the present invention, the treatment chamber is kept at the predetermined concentration of the gas having a kinematic viscosity coefficient higher than that of air at all times, so that the coating treatment for the substrate to be processed can be optimally performed without reducing the apparatus operation rate. More specifically, according to the present invention, the kinematic viscosity coefficient of an atmosphere in the treatment chamber is made higher than that of air, so that drying of the coating solution at the outer periphery side can be made slower than that at the rotation center side of the substrate to be processed during the coating treatment.

The gas supply mechanism may have a circulation pipe connecting a gas supply port for supplying the gas into the treatment chamber and an exhaust port for exhausting the gas in the treatment chamber, and the gas supply mechanism may have a gas temperature and humidity regulator for regulating temperature and humidity of the gas in the circulation pipe, a gas concentration sensor, and a gas/liquid separator for separating the gas exhausted from the exhaust port into gas and liquid and returning only the gas into the circulation pipe, and further have a gas supply source for replenishing the circulation pipe with the gas based on a detection signal from the gas concentration sensor. This configuration allows cyclic use of the gas forming the atmosphere in the treatment chamber and replenishment of the circulation pipe with the gas based on the detection signal from the gas concentration sensor, thereby keeping the gas concentration at a predetermined concentration, resulting in effective use of the gas.

A vacuum mechanism for bringing an inside of the pre-processing chamber into a vacuum state and the gas supply mechanism having the gas supply source for replacing the inside of the pre-processing chamber with the gas having a kinematic viscosity coefficient higher than that of air may connected to the pre-processing chamber to keep gas concentrations in the pre-processing chamber and the treatment chamber equal at least when the substrate to be processed is transferred from the pre-processing chamber to the treatment chamber. This configuration allows the gas concentration to be kept high during replacement of the air in the pre-processing chamber or the post-processing chamber with, for example, helium gas. Further, the pressure difference between the pre-processing chamber, the treatment chamber and the post-processing chamber is eliminated during transfer to eliminate airflow. Accordingly, the coating treatment can be performed without air turbulence to make the coating film thickness uniform.

Further, in the case of using helium gas, the treatment can be performed in the helium gas, so that the coating film thickness can be stabilized and improved in uniformity.

Connecting the pre-processing chamber housing the cooling means and the post-processing chamber housing the heating means to the treatment chamber via the transfer in/out port for the substrate to be processed can improve the efficiency of the thermal processing before and after the coating treatment.

DETAILED DESCRIPTION OF THE INVENTION

Hereinafter, preferred embodiments of the present invention will be described in detail with reference to the accompanying drawings. A case in which a substrate processing apparatus according to the present invention is applied to a resist coating and developing treatment apparatus for a semiconductor wafer will be described here.

Figure 1:
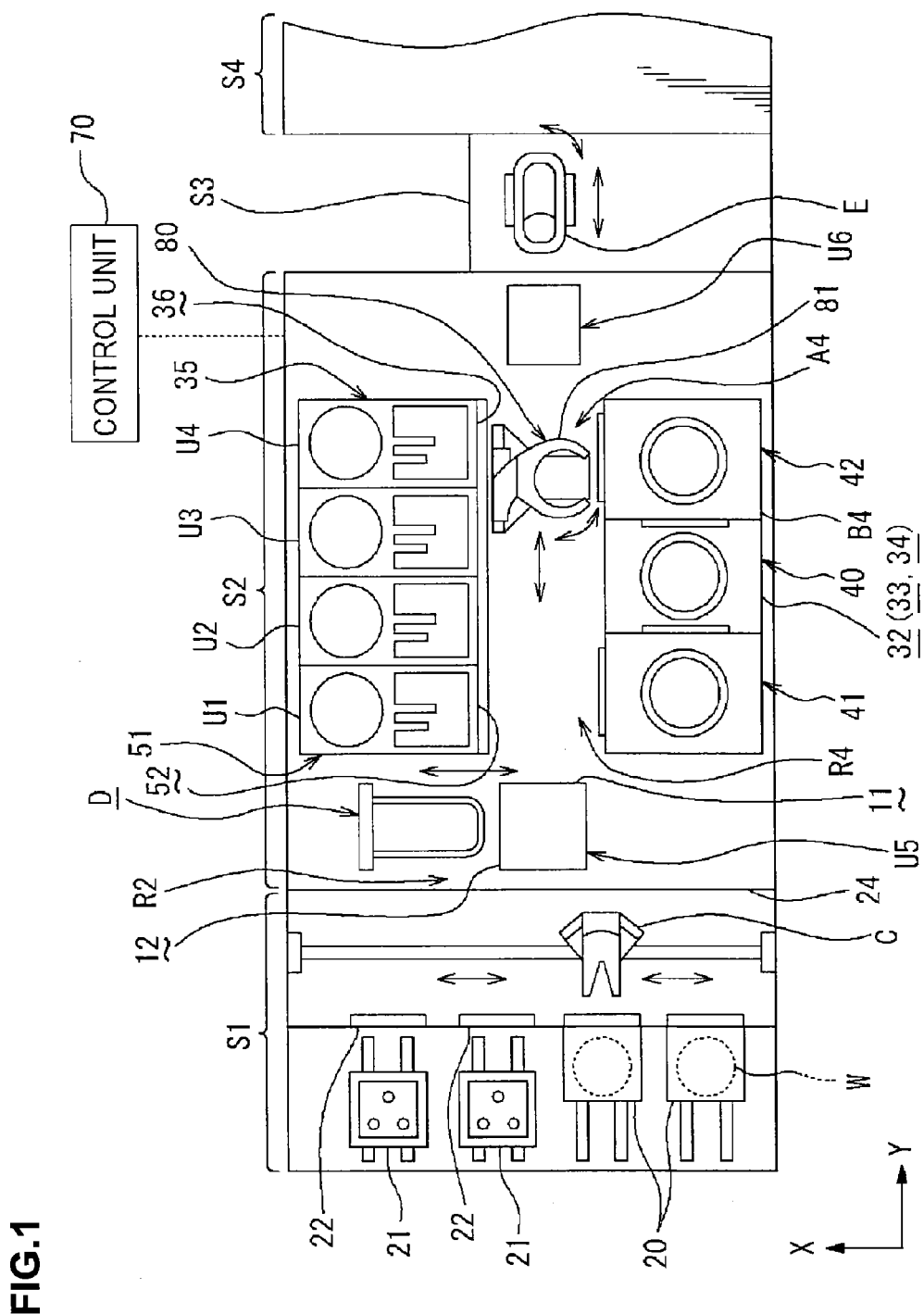
FIG. 1 is an explanatory view schematically showing, in a plan view, a resist coating and developing treatment apparatus to which the present invention is applied.
Figure 2:
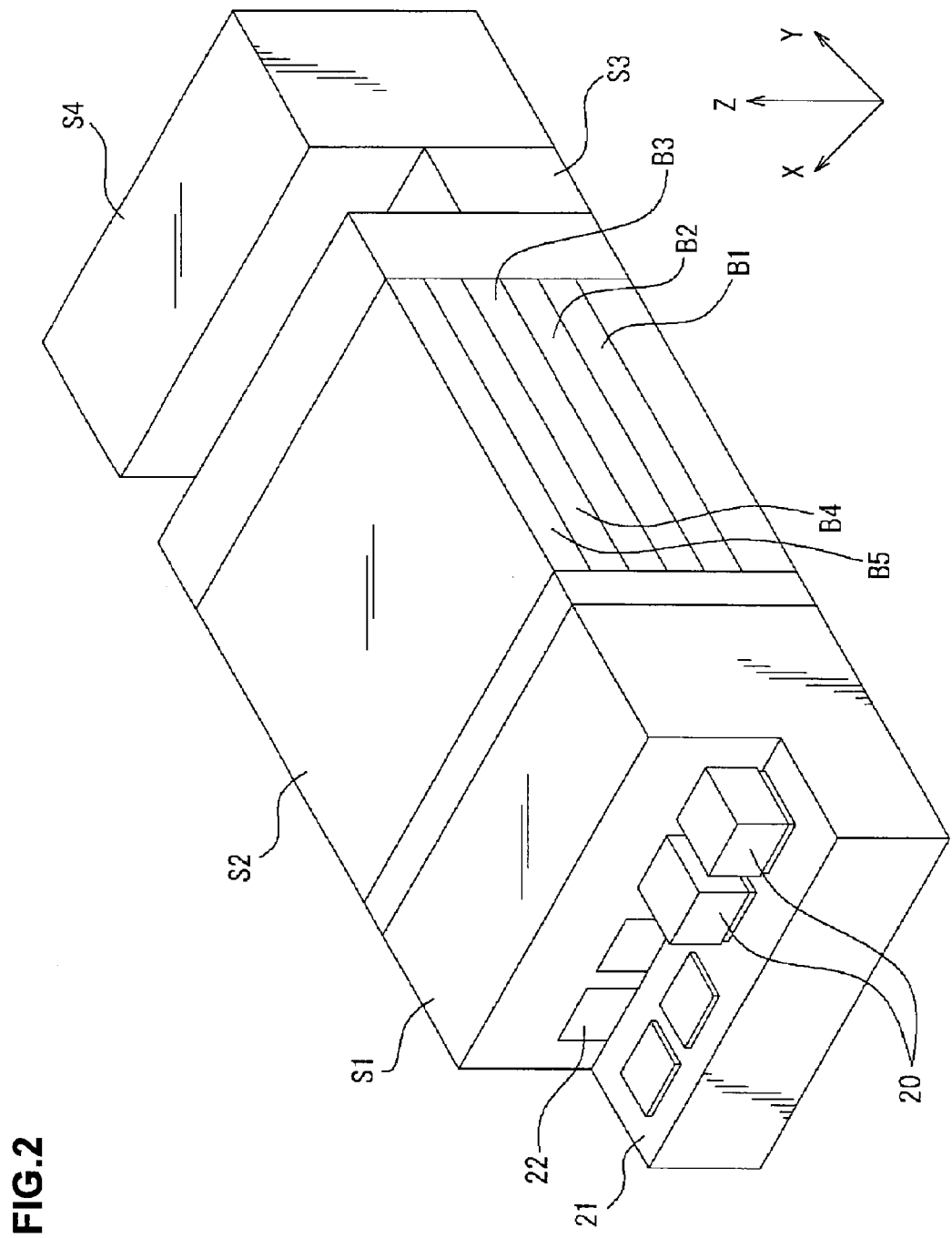
FIG. 2 is a perspective view of the resist coating and developing treatment apparatus in FIG. 1.
Figure 3:
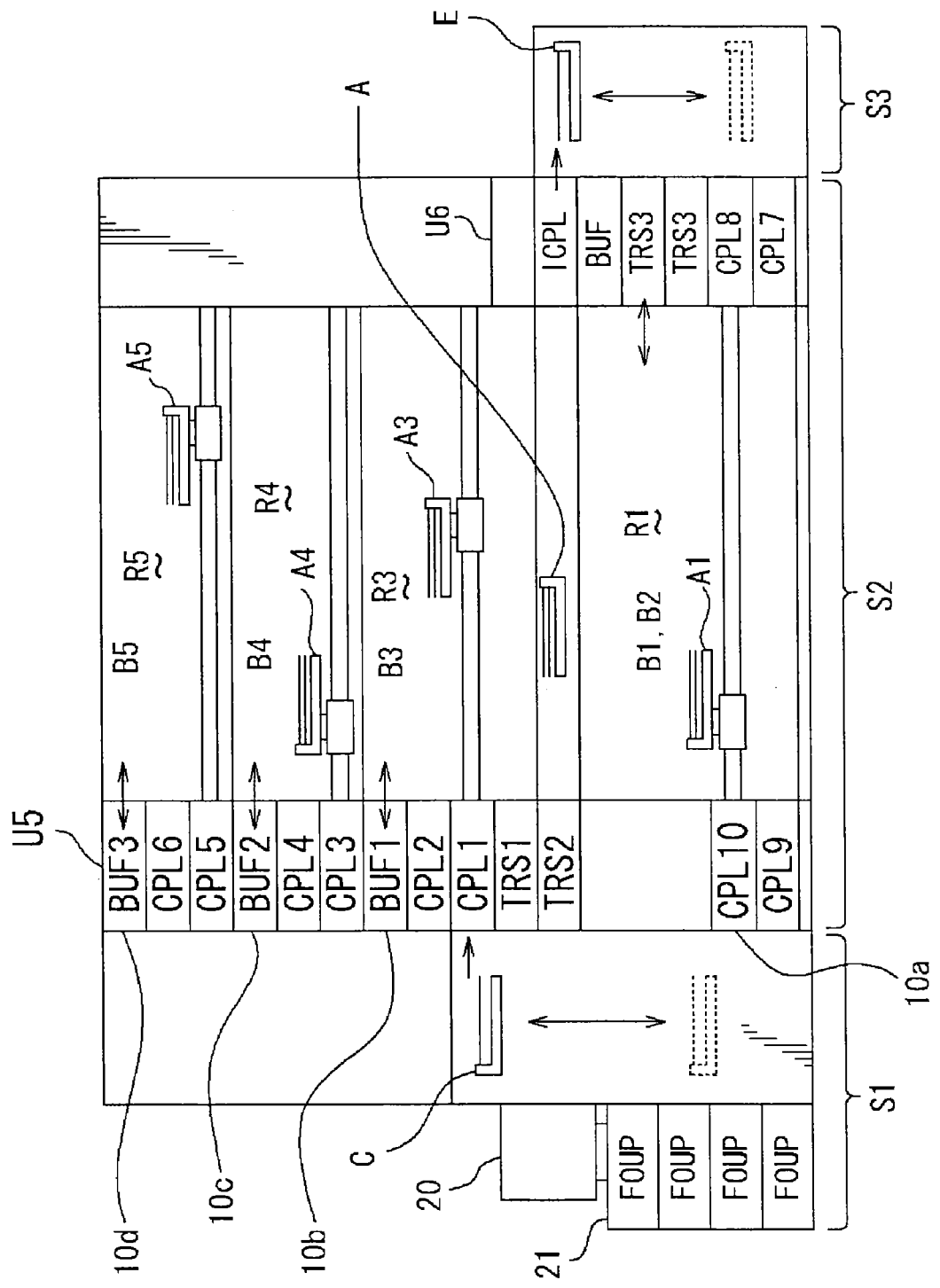
FIG. 3 is an explanatory view schematically showing a longitudinal section of the resist coating and developing treatment apparatus in FIG. 1.

FIG. 1 is a schematic plan view showing an example of the resist coating and developing treatment apparatus, FIG. 2 is a schematic perspective view of the same, and FIG. 3 is a schematic sectional view of the same.

The resist coating and developing treatment apparatus includes a carrier block S1 for transferring in/out a carrier 20 hermetically housing, for example, 13 semiconductor wafers W (hereinafter, referred to as wafers W) that are substrates to be processed; a processing block S2 composed of a plurality of, for example, five unit blocks B1 to B5; and an interface block S3 for delivering the wafer W to/from an aligner S4.

In the carrier block S1, a plurality of (for example, four) mounting tables 21 capable of mounting carriers 20 thereon, opening/closing portions 22 provided on a front wall surface when seen from the mounting tables 21, and a transfer arm C for taking out the wafer W from the carrier 20 via the opening/closing portion 22, are provided. This transfer arm C is configured to be movable in horizontal X- and Y-directions and a vertical Z-direction and rotatable and movable around the vertical axis, so as to deliver the wafer W to/from delivery stages TRS1 and TRS2 provided in a later-described shelf unit U5 constituting a substrate housing section.

To the back side of the carrier block S1, the processing block S2 is connected which is surrounded at its periphery by a casing 24. In the processing block S2, in this example, from the bottom, two tiers on the lower tier side are allotted to first and second unit blocks (DEV layers) B1 and B2 for performing developing treatment, and the remaining tiers are allotted to the third unit block (BCT layer) B3 being a first anti-reflection film forming unit block for performing treatment of forming an anti-reflection film to be formed on the lower side of a resist film (hereinafter, referred to as a "first anti-reflection film"), the fourth unit block (COT layer) B4 being a coating film forming unit block for performing coating treatment of a resist solution, and the fifth unit block (TCT layer) B5 being a second anti-reflection film forming unit block for performing treatment of forming an anti-reflection film to be formed on the upper side of the resist film (hereinafter, referred to as a "second anti-reflection film"). The DEV layers B1 and B2 correspond to developing treatment unit blocks, and the BCT layer B3, the COT layer B4, and the TCT layer B5 correspond to coating film forming unit blocks.

Next, configurations of the first to fifth unit blocks B (B1 to B5) will be described. These unit blocks B1 to B5 include solution treatment units provided on the front side for applying chemicals to the wafer W; processing unit such as various heating units and the like provided on the rear side for performing pre-processing and post-processing of the treatment performed in the solution treatments; and main arms A1 and A3 to A5 which are dedicated substrate transfer means for delivering the wafer W between the solution treatment units arranged on the front side and the processing units such as the heating units and the like arranged on the rear side.

These unit blocks B1 to B5 are formed to have the same arrangement layout of the solution treatment units, the processing unit such as the heating units and the like, and the transfer means. The same arrangement layout means that the center of the wafer W mounted in each treatment or processing unit, that is, the center of a spin chuck being a holding means for the wafer W in the solution treatment unit and the center of a heating plate and a cooling plate in the heating unit are the same.

The unit blocks (DEV layers) B1 and B2 are similarly configured, and in this case, they are formed in common. In the unit blocks (DEV layers) B1 and B2, a transfer region R1 for the wafer W (a horizontal moving region of the main arm A1) for connecting the carrier block S1 and the interface block S3 is formed in the direction of the unit blocks (DEV layers) B1 and B2 (the Y-direction in the drawing) at almost middle of the unit blocks (DEV layers) B1 and B2 (see FIG. 3).

Figure 4:
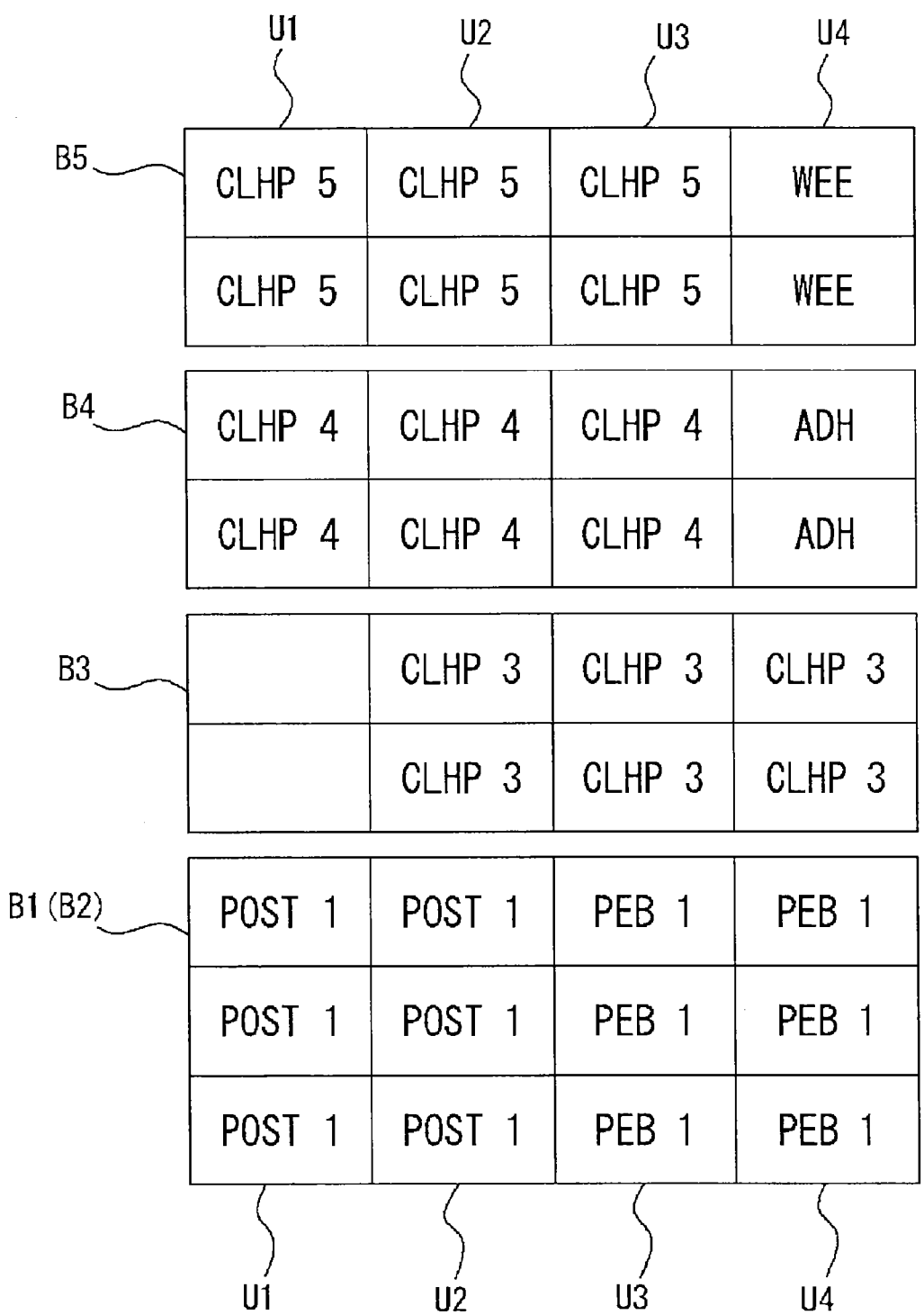
FIG. 4 is an explanatory view schematically showing a section of an example of treatment and processing units in a processing block in the present invention.

On both sides of this transfer region R1 as seen from the carrier block S1 side, developing units (not shown) including a plurality of developing treatment sections for performing developing treatment are provided as the solution treatment units, for example, in two tiers on the right side from the near side (the carrier block S1 side) to the back side. In each of the unit blocks, four shelf units U1, U2, U3, and U4 in each of which heating system units are multi-tiered are provided in order on the left side from the near side to the back side. In FIG. 4, various units for performing pre-processing and post-processing of the treatment performed in the developing unit are stacked in a plurality of tiers, for example, three tiers. In this manner, the developing units and the shelf units U1 to U4 are partitioned by the transfer region R1, and a cleaning air is jetted to the transfer region R1 and exhausted therefrom to suppress floating of particles in the region.

The aforementioned various units for performing pre-processing and post-processing include, for example, as shown in FIG. 4, heating units (PEB1) called post-exposure baking units for performing heating processing on the wafer W after exposure, heating units (POST1) called post-baking units for performing heating processing to extract water from the wafer W after developing treatment and so on. These processing units such as the heating units (PEB1 and POST1) are housed in the respective processing containers (not shown), and each of the shelf units U1 to U4 is composed of the processing containers are stacked in three tiers, and a wafer transfer in/out port 36 is formed in a surface of each of the processing containers facing the transfer region R1.

All of the coating film forming unit blocks B3 to B5 are basically similarly formed and formed similarly to the above-described developing treatment unit blocks B1 and B2. Specifically, explaining the unit block (COT layer) B4 as an example with reference to FIG. 1, FIG. 3 and FIG. 4, a coating unit 32 for performing coating treatment of a resist solution to the wafer W is provided as the solution treatment unit, and heating units (CLHP4) for performing heating processing on the wafer W after resist solution is applied, and hydrophobic treatment units (ADH) for improving adhesion between the resist solution and the wafer W are provided in the shelf units U1 to U4 in the unit block (COT layer) B4, and the unit block (COT layer) B4 is thus configured similarly to the unit blocks (DEV layers) B1 and B2. More specifically the unit block (COT layer) B4 is configured such that the coating unit 32 is partitioned from the heating units (CLHP4) and the hydrophobic treatment units (ADH) by a transfer region R4 of the main arm A4 (a horizontal moving region of the main arm A4). In this COT layer B4, the main arm A4 delivers the wafer W to the delivery stage TRS1 in the shelf unit U5, the coating unit 32, and the treatment and processing units in the shelf units U1 to U4. Note that the hydrophobic treatment unit (ADH), which performs gas treatment in an HMDS atmosphere, may be provided in any one of the coating film forming unit blocks B3 to B5.

In the unit block (BCT layer) B3, a first anti-reflection film forming unit 33 for performing treatment of forming a first anti-reflection film to the wafer W is provided as the solution treatment unit, and heating units (CLHP3) for performing heating processing on the wafer W after the anti-reflection film forming treatment are provided in the shelf units U1 to U4, and the unit block (BCT layer) B3 is thus configured similarly to the unit block (COT layer) B4. More specifically, the unit block (BCT layer) B3 is configured such that the first anti-reflection film forming unit 33 is partitioned from the heating units (CLHP3) by a transfer region R3 of the main arm A3 (a horizontal moving region of the main arm A3). In this third unit block B3, the main arm A3 delivers the wafer W to the delivery stage TRS1 in the shelf unit U5, the first anti-reflection film forming unit 33, and the treatment and processing units in the shelf units U1 to U4.

The unit block (TCT layer) B5 is configured similarly to the unit block (COT layer) B4 except that a second anti-reflection film forming unit 34 for performing treatment of forming a second anti-reflection film to the wafer W is provided as the solution treatment unit, and heating units (CLHP5) for performing heating processing on the wafer W after the anti-reflection film forming treatment and edge exposure units (WEE) are provided in the shelf units U1 to U4. More specifically, the unit block (TCT layer) B5 is configured such that the second anti-reflection film forming unit 34 is partitioned from the heating units (CLHP5) and the edge exposure units (WEE) by a transfer region R5 of the main arm A5 (a horizontal moving region of the main arm A5). In this unit block (TCT layer) B5, the main arm A5 delivers the wafer W to the delivery stage TRS1 in the shelf unit U5, the second anti-reflection film forming unit 34, and the treatment and processing units in the shelf units U1 to U4.

In the transfer regions R1, R3 to R5, the main arms A1, A3 to A5 are provided. The main arms A1, A3 to A5 are configured to deliver the wafer between all of the modules (locations where the wafer W is placed) in the unit blocks (DEV layers) B1 and B2, the unit block (BCT layer) B3, the unit block (COT layer) B4, and the unit block (TCT layer) B5, for example, between the treatment and processing units in the shelf units U1 to U4, the developing units, the coating unit 32, the first and second anti-reflection film forming units 33 and 34, and the sections in the shelf unit U5, and are configured to be movable in the horizontal X- and Y-directions and a vertical Z-direction and rotatable around the vertical axis.

FIG. 4 shows an example of the layout of those treatment and processing units, which layout is presented for convenience sake, and the treatment and processing units to be provided are not limited to the heating units (CLHP, PEB, POST), the hydrophobic treatment units (ADH), and the edge exposure units (WEE) but may be other treatment and processing units. In the actual apparatus, the number of units to be installed is determined in consideration of the processing time in each of the treatment and processing units.

As will be described later, in the structure in which a cooling means for cooling the wafer W before resist coating and a heating means for heating the wafer W after the resist coating are provided in the coating unit 32, the heating units (CLHP) may not be provided in the unit block (COT layer) B4.

In the processing block S2, a shuttle arm A that is a substrate transfer means for delivering the wafer W between the deliver stage TRS2 provided in the shelf unit U5 and a shelf unit U6 on the interface block S3 side is disposed to be movable in the horizontal Y-direction and ascendable and descendable in the vertical Z-direction.

The transfer region of the shuttle arm A and the transfer regions R1, R3 to R5 of the main arms A1, A3 to A5 are partitioned.

A region between the processing block S2 and the carrier block S1 is a delivery region R2 for the wafer W, and in the region R2, as shown in FIG. 1, the shelf unit U5 that is a substrate housing section is provided at a position to which the transfer arm C, the main arms A1, A3 to A5, and the shuttle arm can access, and a delivery arm D for delivering the wafer W to the shelf unit U5 is provided. In this case, the shelf unit U5 is disposed on an axis of the horizontal movement direction (the Y-direction) of the main arm A1, A3 to A5, and the shuttle arm A, and is provided with a first opening 11 in a proceeding/retracting direction of the main arms A1, A3 to A5 and the shuttle arm A (the Y-direction), and a second opening 12 in a proceeding/retracting direction of the delivery arm D (the X-direction).

The shelf unit U5 includes, for example, two delivery stages TRS1 and TRS2 to delivery the wafer W to/from the main arms A1, A3 to A5 in the unit blocks B1 to B5 and the shuttle arm A as shown in FIG. 3. The shelf unit U5 further includes housing blocks 10a to 10d partitioned to correspond to the unit blocks B1 to B5. The housing blocks 10a to 10d include a plurality of mounting shelves BUF1, BUF2, and BUF3, and the cooling plates CPL1 to CPL6. The cooling plates CPL1 to CPL6 are used to adjust the wafer to a predetermined temperature before resist coating, adjust the wafer W to a predetermined temperature before anti-reflection film forming treatment, and adjust the wafer W which has been subjected to heating processing after exposure to a predetermined temperature.

All of the main arms A1, A3 to A5 are similarly configured, and the main arm A4 has, described as a representative, an arm main body 80 having, for example, two curved arm portions 81 for supporting a rim region on the rear surface side of the wafer W as shown in FIG. 1. The curved arm portions 81 are configured to freely proceed and retract in the X-direction, to be movable in the Y-direction, ascendable and descendable and rotatable around the vertical axis, and thus can deliver the wafer W to/from the units in the shelf units U1 to U6, the delivery stage TRS1, and the solution treatment units. Driving of such a main arm A4 is controlled by a not-shown controller based on the instruction from a control unit 70. Further, to prevent accumulation of heat in the main arm A1 (A3 to A5) in the heating units, the order of receiving the wafer W can be arbitrarily controlled.

In a region of the processing block S2 adjacent to the interface block S3, the shelf unit U6 is provided at a position to which the main arm A1 and the shuttle arm A can access as shown in FIG. 3. From/to the shelf unit U6, the wafer W is delivered to/from the main arm A1 in the unit blocks DEV layers B1 and B2 as shown in FIG. 3. In this example, the shelf unit U6 includes two delivery stages TRS3 and a delivery stage ICPL having a cooling function for delivering the wafer W to/from the shuttle arm A.

On the other hand, the aligner S4 is connected to the back side of the shelf unit U6 in the processing block S2 via the interface block S3. In the interface block S3, an interface arm E is provided for delivering the wafer W to the sections in the shelf unit U6 in the unit blocks (DEV layers) B1 and B2 in the processing block S2, and the aligner S4. This interface arm E forms a transfer means for the wafer W intervening between the processing block S2 and the aligner S4. In this example, the interface arm E is configured to be movable in the horizontal X- and Y-directions and movable in the vertical Z-direction and rotatable around the vertical axis so as to deliver the wafer W to the delivery stages TRS3 and ICPL in the DEV layers B1 and B2.

The resist coating and developing treatment apparatus configured as described above is configured such that the above described delivery arm D can freely deliver the wafer W between the unit blocks B1 to B5 stacked in five tiers via the delivery stages TRS1 and TRS2, and the above-described interface arm E can deliver the wafer W between the processing block S2 and the aligner S4 via the developing treatment unit blocks B1 and B2.

Next, an aspect of processing the wafer W in the resist coating and developing treatment apparatus configured as described above will be described with reference to FIG. 1 to FIG. 4. Note that a case will be described here in which cooling plates CPL9 and CPL10 in two tiers are arranged in the first housing block 10a in the lowermost tier of the housing block 10a to 10d in the shelf unit U5, cooling plates CPL1 and CPL2 in two tiers and a plurality of mounting shelves BUF1 are arranged in the second housing block 10b in the tier upper than the first housing block 10a, cooling plates CPL3 and CPL4 in two tiers and a plurality of mounting shelves BUF2 are arranged in the third housing block 10c in the tier upper than the second housing block 10b, and cooling plates CPL5 and CPL6 in two tiers and a plurality of mounting shelves BUF3 are arranged in the fourth housing block 10d in the tier upper than the third housing block 10c, that is, the uppermost tier.

In the case without anti-reflection film, the carrier 20 is transferred from the outside into the carrier block 21, and a wafer W is taken out from the carrier 20 by the transfer arm C. The wafer W is transferred by the transfer arm C into the delivery stage TRS1 in the shelf unit U5, and then transferred by the delivery arm D to the cooling plate CPL3 in the third housing block 10c in the shelf unit U5, and delivered to the main arm A4 in the unit block (COT layer) B4 via the cooling plate CPL3. The wafer W is then transferred by the main arm A4 to the hydrophobic treatment unit (ADH) and subjected to hydrophobic treatment, and then transferred again to the cooling plate CPL4 in the third housing block 10c in the shelf unit U5 and adjusted to a predetermined temperature. The wafer W taken out from the shelf unit U5 by the main arm A4 is then transferred to the coating unit 32 where a resist film is formed on the wafer W.

The wafer W on which the resist film has been formed is transferred by the main arm A4 to the heating unit (CLHP4) and subjected to pre-baking for evaporation of a solvent from the resist film. The wafer W is then housed by the main arm A4 on the mounting shelf BUF2 in the third housing block 10c in the shelf unit U5 and temporarily waits there, and the delivery arm D then enters the mounting shelf BUF2 in the third housing block 10c in the shelf unit U5 and receives the wafer W and delivers the wafer W to the delivery stage TRS2 in the shelf unit U5. Subsequently, the wafer W is transferred by the shuttle arm A to the delivery stage ICPL in the shelf unit U6. The wafer W on the delivery stage ICPL is then transferred by the interface arm E to the aligner S4 and subjected to predetermined exposure processing.

The wafer W after exposure processing is transferred by the interface arm E to the delivery stage TRS3 in the shelf unit U6 in order that the wafer W is delivered to the unit block (DEV layer) B1 or the unit block (DEV layer) B2, and the wafer W on the stage TRS3 is received by the main arm A1 in the unit block (DEV layer) B1 or the unit block (DEV layer) B2, and then first subjected to heating processing in the heating unit (PEB1) in the unit block (DEV layer) B1 or the unit block (DEV layer) B2, and then transferred by the main arm A1 to the cooling plate CPL7 (CPL8) in the shelf unit U6 and adjusted to a predetermined temperature. Subsequently, the wafer W is taken out by the main arm A1 from the shelf unit U6 and transferred to a developing unit 31 and coated with a developing solution. The wafer W is then transferred by the main arm A1 to the heating unit (POST1) and subjected to a predetermined developing treatment.

The wafer W which has been subjected to the developing treatment is transferred to the CPL 9 (CPL10) in the first housing block 10a in the shelf unit U5 and adjusted to a predetermined temperature in order that the wafer W is delivered to the transfer arm C, and then returned by the transfer arm C to the original carrier 20 mounted in the carrier block S1.

When an anti-reflection film is formed on the lower side of the resist film, the wafer W is delivered from the transfer arm C to the delivery arm D, and then transferred by the delivery arm D to the cooling plate CPL1 in the second housing block 10b in the shelf unit U5 and delivered to the main arm A3 in the unit block (BCT layer) B3 via the cooling plate CPL1.

In the unit block (BCT layer) B3, the wafer W is transferred by the main arm A3 from the first anti-reflection film forming unit 33 to the heating unit (CLHP3), and then to the mounting shelf BUF1 in the second housing block 10b in the shelf unit U5, whereby the first anti-reflection film is formed on the wafer W. The wafer W mounted on the mounting shelf BUF1 in the second housing block 10b is transferred by the delivery arm D to the cooling plate CPL3 (CPL4) in the third housing block 10c and adjusted to a predetermined temperature.

Subsequently, the wafer W in the third housing block 10c is transferred by the main arm A3 from the coating unit 32 to the heating unit CLHP4, and then to the mounting shelf BUF2 in the third housing block 10c in the shelf unit U5, whereby the resist film is formed on the first anti-reflection film.

The delivery arm D then enters the mounting shelf BUF2 in the third housing block 10c in the shelf unit U5 and receives the wafer W, and delivers the wafer W to the delivery stage TRS2 in the shelf unit U5. Subsequently, the wafer W is transferred by the shuttle arm A to the delivery stage ICPL in the shelf unit U6. The wafer W on the delivery stage ICPL is subsequently transferred by the interface arm E to the aligner S4 and subjected to predetermined exposure processing. Thereafter, the developing treatment is performed in a process similar to that described above.

When an anti-reflection film is formed on the upper side of the resist film, the wafer W is delivered by the main arm A4 from the hydrophobic treatment unit (ADH) to the cooling plate CPL4 in the third housing block 10c in the shelf unit U5 and adjusted to a predetermined temperature, and the wafer W taken out from the shelf unit U5 by the main arm A4 is transferred to the coating unit 32 where a resist film is formed on the wafer W. The wafer W on which the resist film has been formed is transferred by the main arm A4 to the heating unit (CLHP4) and subjected to pre-baking for evaporation of a solvent from the resist film. The wafer W is then housed by the main arm A4 on the mounting shelf BUF2 in the third housing block 10c in the shelf unit U5 and temporarily waits there.

The wafer W in the third housing block 10c is subsequently transferred by the delivery arm D to the cooling plate CPL5 (CPL6) in the fourth housing block 10d in the shelf unit U5 and adjusted to a predetermined temperature, and then delivered to the main arm A5 in the unit block (TCT layer) B5. In the unit block (TCT layer) B5, the wafer W is transferred by the main arm A5 from the second anti-reflection film forming unit 34 to the heating unit (CLHP5), and then to the mounting shelf BUF3 in the fourth housing block 10d in the shelf unit U5, whereby the second anti-reflection film is formed on the wafer W. In this case, after the heating processing by the heating unit (CLHP5), the wafer W may be transferred to the edge exposure unit (WEE) and subjected to edge exposure processing, and then transferred to the mounting shelf BUF3 in the fourth housing block 10d in the shelf unit U5.

The delivery arm D then enters the mounting shelf BUF3 in the fourth housing block 10d in the shelf unit U5 and receives the wafer W, and delivers the wafer W to the delivery stage TRS2 in the shelf unit U5. Subsequently, the wafer W is transferred by the shuttle arm A to the delivery stage ICPL in the shelf unit U6. The wafer W on the delivery stage ICPL is then transferred by the interface arm E to the aligner S4 and subjected to predetermined exposure processing. Thereafter, the developing treatment is performed in a process similar to that described above.

When anti-reflection films are formed on the lower side and the upper side of the resist film, the above-described transfer processing to form the anti-reflection film on the lower side of the resist film and transfer processing to form the anti-reflection film on the upper side of the resist film can be combined to form the anti-reflection films are formed on the lower side and the upper side of the resist film.

The above-described coating and developing treatment apparatus comprises the control unit 70 composed of a computer for performing management of recipes for the treatment and processing units, schedule management for the transfer flow (transfer path) of the wafer W, treatment and processing in the treatment and processing units, and drive control of the main arms A1, A3 to A5, the transfer arm C, the deliver arm D, and the interface arm E. This control unit 70 uses the unit blocks B1 to B5 to transfer the wafer W and perform treatment and processing.

The schedule of the transfer flow designates the transfer path (transfer order) of the wafer W in the unit block, and created for each of the unit blocks B1 to B5 according to the kind of a coating film to be formed, whereby a plurality of transfer flow schedules are stored in the schedule control unit 70 for each of the unit blocks B1 to B5.

The following modes are prepared for the coating films to be formed:

(1) a mode of transferring the wafer W to all of the unit blocks B1 to B5;

(2) a mode of transferring the wafer W to unit blocks (DEV layers) B1 and B2 where developing treatment is performed, the unit block (COT layer) B4 where coating of the resist solution is performed, and the unit block (BCT layer) B3 for forming the first anti-reflection film;

(3) a mode of transferring the wafer W to unit blocks (DEV layers) B1 and B2 where developing treatment is performed, the unit block (COT layer) B4 where coating of the resist solution is performed, and the unit block (TCT layer) B5 for forming the second anti-reflection film; and (4) a mode of transferring the wafer W only to the unit blocks (DEV layers) B1 and B2 where developing treatment is performed.

A mode selecting means of the control unit 70 selects the unit blocks to which the wafer W is transferred depending on the kind of the coating film to be formed, and selects an optimal recipe from the plurality of transfer flow schedules prepared for each of the selected unit blocks, whereby the unit blocks to be used are selected according to the coating film to be formed, and driving of the treatment and processing units and arms is controlled in those unit blocks so that a series of processing is performed.

In such a coating and developing treatment apparatus, the coating film forming unit blocks and the developing treatment unit block are provided in different areas and the respective dedicated main transfer arms A1, A3 to A5 and the shuttle arm A are provided, so that the loads to the arms A1, A3 to A5, and A are reduced. This improves the transfer efficiencies of the arms A1, A3 to A5, and A, with the effect that the throughput can be increased.

Next, a case in which the substrate processing apparatus according to the present invention is applied to the coating unit 32 will be described.

First Embodiment

Figure 5:
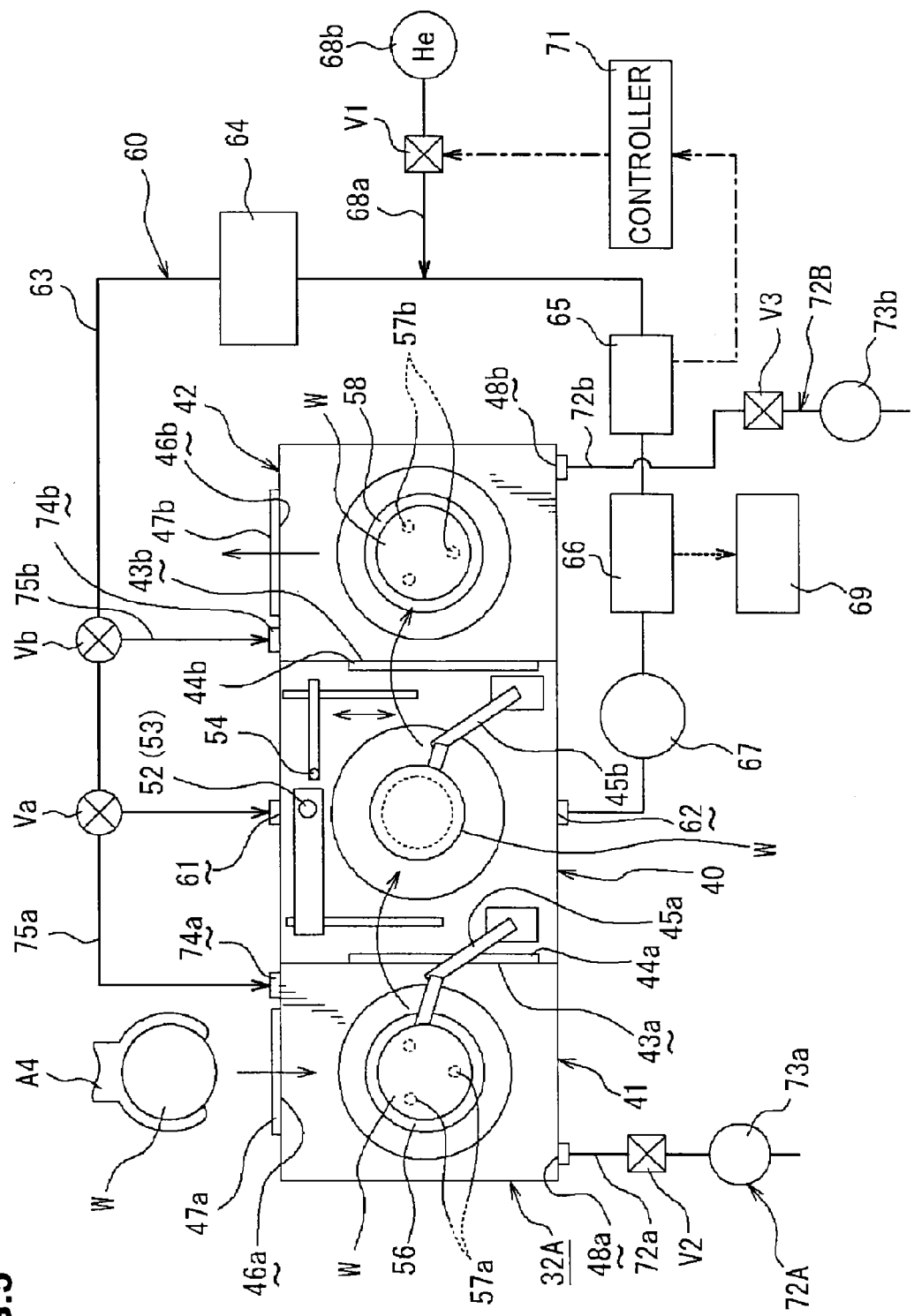
FIG. 5 is an explanatory view schematically showing, in a plan view, a first embodiment of a substrate processing apparatus according to the present invention.
Figure 6:
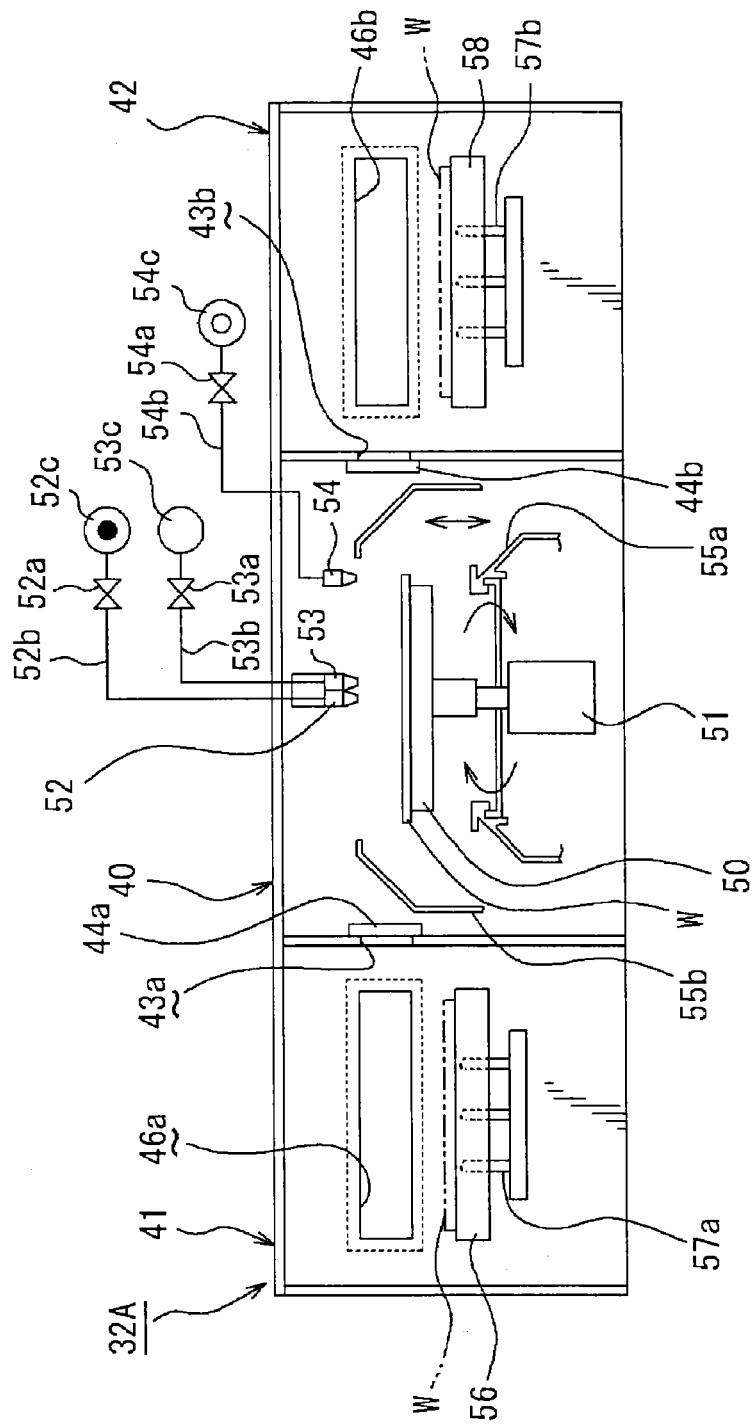
FIG. 6 is an explanatory view schematically showing a longitudinal section of the first embodiment in FIG. 5.

FIG. 5 is a schematic sectional view showing a first embodiment of the substrate processing apparatus according to the present invention, and FIG. 6 is a schematic sectional view of FIG. 5.

A coating unit 32A that is the substrate processing apparatus of the first embodiment includes a treatment chamber 40 for performing coating treatment to form a coating film (a resist film) of the wafer W, a pre-processing chamber 41 for cooling the wafer W before the coating treatment to a predetermined temperature, for example, 23° C., and a post-processing chamber 42 for heating the wafer W after the coating treatment to a predetermined temperature, for example, 100° C. to evaporate a remaining solvent in the resist film, are connected with the treatment chamber 40 being located at the middle. Further, the treatment chamber 40, the pre-processing chamber 41 and the post-processing chamber 42 are provided with transfer in/out ports 43*a* and 43*b* for the wafer W. At the transfer in/out ports 43*a* and 43*b*, shutters 44*a* and 44*b* for opening/closing the transfer in/out ports 43*a* and 43*b* are provided respectively. In one of the treatment chamber 40, the pre-processing chamber 41 and the post-processing chamber 42 (the treatment chamber 40 is shown in the drawing), two transfer arms 45*a* and 45*b* are provided for delivering the wafer W between the treatment chamber 40, the pre-processing chamber 41, and the post-processing chamber 42.

In the treatment chamber 40, as shown in FIG. 6, a spin chuck 50 being a holding means for rotatably holding the wafer W, a motor 51 for rotationally driving the spin chuck 50, a coating solution supply nozzle 52 for supplying a resist solution being a coating solution to the front surface of the wafer W held on the spin chuck 50, a thinner nozzle 53 for supplying a thinner being a solvent of the resist, and a rinse nozzle 54 for supplying a rinse solution to the rim and the rear surface of the wafer W are housed. An inner cup 55*a* is disposed below the spin chuck 50, and an outer cup 55*b* capable of moving up and down is disposed outside and beside the spin chuck 50.

The coating solution supply nozzle 52 is connected to a resist tank 52*c* being a coating solution supply source via a coating solution supply pipe 52*b* provided with an opening/closing valve 52*a*. The thinner nozzle 53 is connected to a thinner tank 53*c* via a thinner supply pipe 53*b* provided with an opening/closing valve 53*a*. The rinse nozzle 54 is connected to a pure water tank 54*c* being a rinse solution supply source via a rinse solution supply pipe 54*b* provided with an opening/closing valve 54*a*.

In the pre-processing chamber 41, a cooling plate 56 is housed that is a cooling means for cooling the wafer W before the resist solution is applied to the wafer W to a predetermined temperature (23° C.). On the side wall on the transfer region R4 side in the pre-processing chamber 41, a transfer-in port 46*a* for the wafer W is provided, and an entrance shutter 47*a* is provided that opens/closes the transfer-in port 46*a*. Through the transfer-in port 46*a*, the wafer W is transferred by the main arm A4 into the pre-processing chamber 41 and then delivered to raising and lowering pins 57*a*, and the raising and lowering pins 57*a* lower to mount the wafer W on the cooling plate 56.

In the post-processing chamber 42, a heating plate 58 is housed that is a heating means for heating the wafer W coated with the resist solution to a predetermined temperature (100° C.). On the side wall on the transfer region R4 side in the post-processing chamber 42, a transfer-out port 46*b* for the wafer W is provided, and an exit shutter 47*b* is provided that opens/closes the transfer-out port 46*b*. When the wafer W is transferred out through the transfer-out port 46*b*, the wafer W moved to above the heating plate 58 by rise of the raising and lowering pins 57*b* is received by the main arm A4 and transferred out from the post-processing chamber 42.

To the treatment chamber 40, a gas supply mechanism 60 is connected which has a supply source 68*b* of a gas having a kinematic viscosity coefficient higher than that of air, for example, helium (He) gas so that the He gas is kept to a predetermined concentration, for example, 90% or higher at all times.

In this example, the gas supply mechanism 60 comprises a circulation pipe 63 connecting a gas supply port 61 for supplying the He gas into the treatment chamber 40 and an exhaust port 62 for exhausting the gas in the treatment chamber 40. The circulation pipe 63 is provided with, in order from the gas supply port 61 toward the exhaust port 62, a gas temperature and humidity regulator 64 for regulating the temperature and humidity of the He gas (hereinafter, referred to as a temperature and humidity regulator 64); a gas concentration sensor 65; a gas/liquid separator 66 for separating the gas exhausted from the exhaust port 62, that is, the mixed gas of the He gas and the solvent into gas and liquid by cooling, and returning only the He gas into the circulation pipe 63; and an exhauster 67. Between the gas concentration sensor 65 and the temperature and humidity regulator 64, a He gas supply source 68*b* being a gas supply source is connected via a He gas replenish pipe 68*a* provided with an opening/closing valve V1 capable of regulating the flow. Note that a detection signal detected by the gas concentration sensor 65 is transmitted to a controller 71 being a control means, and a signal from the controller 71 is transmitted to the opening/closing valve V1. This replenishes the circulation pipe 63 with the He gas from the gas supply source 68*b* based on the detection signal from the gas concentration sensor 65 to keep the He gas concentration in the treatment chamber 40 to 90% or higher that is optimal to treatment at all times.

With the above configuration, the mixed gas of the He gas and the solvent exhausted from the inside of the treatment chamber 40 by the exhauster 67 is separated into the He gas and the liquefied solvent by the gas/liquid separator 66, and the liquefied solvent is stored into a tank 69 and only the He gas is returned into the circulation pipe 63. The concentration of the He gas returned into the circulation pipe 63 is measured by the gas concentration sensor 65, and when the He gas flowing through the circulation pipe 63 has a predetermined concentration, that is, lower than 90%, the detection signal is transmitted to the controller 71, and the control signal from the controller 71 is transmitted to the opening/closing valve V1, and He gas is replenished from the He gas supply source 68*b* to keep the concentration of the He gas flowing through the circulation pipe 63 to 90% or higher. The He gas kept at a concentration of 90% or higher is adjusted to a predetermined temperature, for example, 23° C. and a humidity of, for example, 5% in the temperature and humidity regulator 64 and then supplied into the post-processing chamber 42. Accordingly, the concentration of the He gas is kept at 90% or higher at all times in the treatment chamber 40. Note that the inside of the treatment chamber 40 is kept at 1 atmospheric pressure as in the external part of the coating unit 32A.

The pre-processing chamber 41 is provided with an exhaust port 48*a*, and a vacuum mechanism 72A is connected to the exhaust port 48*a*. In this example, the vacuum mechanism 72A is configured such that an exhaust pump 73*a* is connected via an opening/closing valve V2 to an exhaust pipe 72*a* connected to the exhaust port 48*a*. The pre-processing chamber 41 is provided with a supply port 74*a*, and a supply pipe 75*a* connected to the supply port 74*a* is connected to the gas supply mechanism 60 via a switch valve Va provided on the supply side of the circulation pipe 63 of the gas supply mechanism 60.

On the other hand, the post-processing chamber 42 is also provided with an exhaust port 48*b* as in the pre-processing chamber 41, and a vacuum mechanism 72B is connected to the exhaust port 48*b*. In this example, the vacuum mechanism 72B is configured such that an exhaust pump 73b is connected via an opening/closing valve V3 to an exhaust pipe 72b connected to the exhaust port 48b. Note that the exhaust pump 73b connected to the exhaust pipe 72b may be connected to the exhaust pipe 72a of the pre-processing chamber 41 so as to be in common with the exhaust pump 73a provided along the exhaust pipe 72a. Further, the post-processing chamber 42 is provided with a supply port 74b, and a supply pipe 75b connected to the supply port 74b is connected to the gas supply mechanism 60 via a switch valve Vb provided on the supply side of the circulation pipe 63 of the gas supply mechanism 60.

In the pre-processing chamber 41 and the post-processing chamber 42 configured as described above, the opening/closing valves V2 and V3 are opened and the exhaust pumps 73a and 73b are driven, whereby the pressures in the pre-processing chamber 41 and the post-processing chamber 42 can be reduced, for example, to 76 Torr or less (0.1 atmospheric pressure or less), and then the driving of the exhaust pumps 73 and 73b are stopped and the opening/closing valves V2 and V3 are kept closed, and the switch valves Va and Vb are operated based on the control signal from the control unit 70 to supply the He gas into the pre-processing chamber 41 and the post-processing chamber 42, whereby the pre-processing chamber 41 and the post-processing chamber 42 can be kept in atmospheres with a concentration of He gas of 90% or higher as in the treatment chamber 40.

Accordingly, there is no difference in pressure between the pre-processing chamber 41, the treatment chamber 40, and the post-processing chamber 42, and the wafer W can be delivered at 1 atmospheric pressure, so that the wafer W can be delivered without air turbulence.

Next, the operation of processing the wafer W in the coating unit 32A configured as described above will be described.

First, the gas supply mechanism 60 is actuated to keep the inside of the treatment chamber 40 in an atmosphere with a concentration of He gas of 90% or higher in advance. In this state, the wafer W taken out from the shelf unit U5 as described above is transferred by the main arm A4 into the pre-processing chamber 41 and delivered to the raising and lowering pins 57a, the main arm A4 then retracts from the pre-processing camber 41, and the raising and lowering pins 57a lower to mount the wafer W on the cooling plate 56. Thereafter or at the same time, the entrance shutter 47a is closed and the opening/closing valve V2 is opened and the exhaust pump 73a is driven to reduce the pressure in the pre-processing chamber 41 (to 0.1 atmospheric pressure or less), while the switch valve Va is operated based on the control signal from the control unit 70 to purge (replace) the He gas in the pre-processing chamber 41 to keep an atmosphere with a concentration of He gas of 90% or higher. Concurrently with the reduction in pressure in the pre-processing chamber 41 and the purge operation, the operation of cooling the wafer W by the cooling plate 56 is performed in parallel. Note that an increase in the pressure reducing time hinders conduction of heat by convection, so that the temperature of the cooling plate 56 cannot reach the target temperature in a short time. Hence, it is desired to reduce, as much as possible, the time required for reducing the pressure, for example, it is desired that the total time required for pressure reduction and He gas purge is 20 second or shorter.

The wafer W which has been subjected to the cooling processing in the pre-processing chamber 41 is moved by rise of the raising and lowering pins 57a to above the cooling plate 56 and received by the transfer arm 45a entering the pre-processing chamber 41 via the transfer in/out port 43a having the shutter 44a being opened, and delivered to the spin chuck 50 in the treatment chamber 40. In this event, both the pre-processing chamber 41 and the treatment chamber 40 have a He gas concentration of 90% or higher and no pressure difference therebetween, causing no air turbulence. After the wafer W is held on the spin chuck 50, the shutter 44a is closed, and the thinner nozzle 53 discharges (supplies) the thinner onto the front surface of the wafer W on the spin chuck 50, and the coating solution supply nozzle 52 discharges (supplies) the resist solution to form a resist film on the wafer surface in the treatment chamber 40. During the resist coating treatment, since an atmosphere with a concentration of the He gas of 90% or higher having a high kinematic viscosity coefficient is kept in the treatment chamber 40, drying of the resist solution on the outer periphery side where the circumferential speed is higher than that on the rotation center side of the wafer W can be made slower. This can make the resist film thickness uniform within the wafer W. After the resist coating, the rinse nozzle 54 discharges (supplies) the rinse solution to the rim and rear surface of the wafer W to thereby perform rinse treatment on the rim and rear surface of the wafer W.

The wafer W on which the resist film has been formed in the treatment chamber 40 is received by the transfer arm 45b and transferred into the post-processing chamber 42 via the transfer in/out port 43b having the shutter 44b opened, and delivered to the raising and lowering pins 57b moving to above the heating plate 58. In this event, both the treatment chamber 40 and the post-processing chamber 42 have a He gas concentration of 90% or higher and no pressure difference therebetween, causing no air turbulence. After the wafer W is delivered to the raising and lowering pins 57b, the shutter 44b is closed, and the raising and lowering pins 57b lower to mount the wafer W on the heating plate 58 in the post-processing chamber 42. Thereafter or at the same time, the opening/closing valve V3 is opened and the exhaust pump 73b is driven to reduce the pressure in the post-processing chamber 42 (to 0.1 atmospheric pressure or less), while the switch valve Vb is operated based on the control signal from the control unit 70 to purge (replace) the He gas in the post-processing chamber 42 to keep an atmosphere with a concentration of He gas of 90% or higher. Concurrently with the reduction in pressure in the post-processing chamber 42 and the purge operation, the operation of heating the wafer W by the heating plate 58 is performed in parallel so that the heating plate 58 evaporates the thinner (solvent) from the resist film. In this case, an increase in the pressure reducing time hinders conduction of heat by convection, so that the temperature of the heating plate 58 cannot reach the target temperature in a short time. Hence, it is desired to reduce, as much as possible, the time required for reducing the pressure, for example, it is desired that the total time required for pressure reduction and He gas purge is 20 second or shorter.

Note that, after thermal processing is performed in the He gas atmosphere in the post-processing chamber 42, the inside of the post-processing chamber 42 may be replaced with air.

In the coating unit 32A configured as described above, the treatment chamber 40, the pre-processing chamber 41, and the post-processing chamber 42 are connected, the cooling plate 56 is housed in the pre-processing chamber 41 and the heating plate 58 is housed in the post-processing chamber 42, thereby eliminating the necessity to provide the above-described heating units (CLHP4) in the fourth unit block B4 (COT layer) and the cooling plates CPL3 and CPL4 in the shelf unit U5 in the resist coating and developing treatment apparatus. Accordingly, the cooling processing can be performed by the cooling plate 56 housed in the pre-processing chamber 41 directly before the coating treatment, and the heating processing can be performed by the heating plate 58 housed in the post-processing chamber 42 connected to the treatment chamber 40 after the coating treatment, so that the throughput can be improved.

The wafer W which has been subjected to heating processing in the post-processing chamber 42 is moved to above the heating plate 58 by rise of the raising and lowering pins 57b, received by the main arm A4 entering the post-processing chamber 42 via the transfer-out port 46b having the exit shutter 47b opened, and transferred out from the post-processing chamber 42. Thereafter, the wafer W is housed on the mounting shelf BUF2 in the third housing block 10c in the shelf unit U5 and temporarily waits there, and is then subjected to exposure processing and then developing treatment in processes similar to those described above.

Second Embodiment

Figure 7:
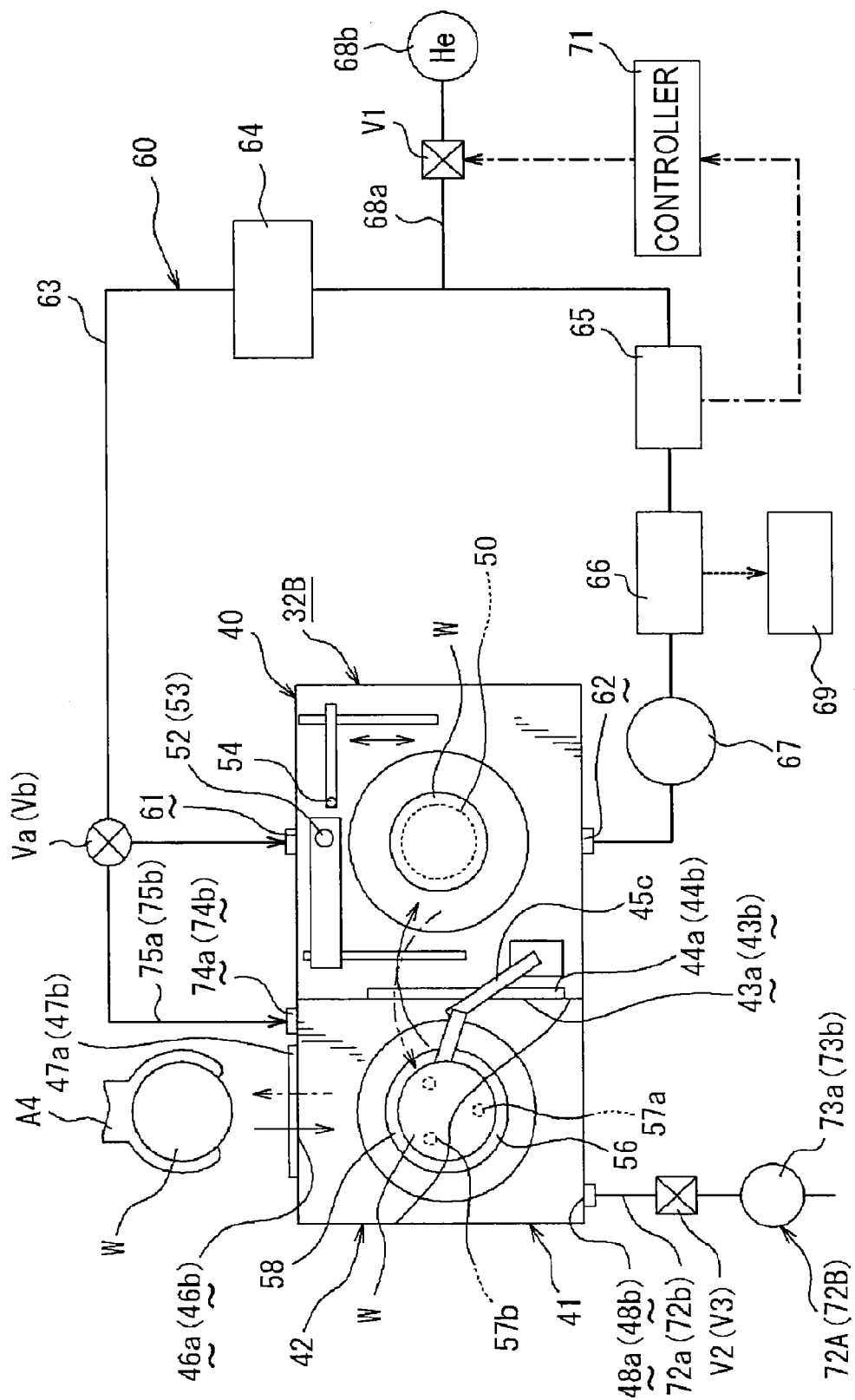
FIG. 7 is an explanatory view schematically showing, in a plan view, a second embodiment of the substrate processing apparatus according to the present invention.

FIG. 7 is a schematic sectional view showing a second embodiment of the substrate processing apparatus according to the present invention.

A coating unit 32B that is the substrate processing apparatus of the second embodiment is a case in which the post-processing chamber 42 is placed on top of the pre-processing chamber 41 in the first embodiment, and the pre-processing chamber 41 and the post-processing chamber 42 are connected to the treatment chamber 40. In this case, the treatment chamber 40, the pre-processing chamber 41 and the post-processing chamber 42 are provided with transfer in/out ports 43a and 43b for the wafer W. At the transfer in/out ports 43a and 43b, shutters 44a and 44b for opening/closing the transfer in/out ports 43a and 43b are provided respectively. In one of the treatment chamber 40, the pre-processing chamber 41 and the post-processing chamber 42 (the treatment chamber 40 is shown in the drawing), a transfer arm 45c is disposed for delivering the wafer W between the treatment chamber 40, the pre-processing chamber 41 and the post-processing chamber 42. Note that the transfer arm 45c is composed of one arm, it is necessary to configure the transfer arm 45c to be ascendable and descendable to positions at the same heights as those of the transfer in/out ports 43a and 43b by a raising and lowering mechanism (not shown). In place of this, two transfer arms 45c may be disposed for transfer between the treatment chamber 40 and the pre-processing chamber 41 and for transfer between the treatment chamber 40 and the post-processing chamber 42.

Note that the second embodiment is the same as the first embodiment except that the pre-processing chamber 41 and the post-processing chamber 42 are arranged one on top of the other, an the same numerals are given to the same portions and the description thereof will be omitted.

An operation aspect of the second embodiment will be described below. First, the gas supply mechanism 60 is actuated to keep the inside of the treatment chamber 40 in an atmosphere with a concentration of He gas of 90% or higher in advance. In this state, the wafer W taken out from the shelf unit U5 as described above is transferred by the main arm A4 into the pre-processing chamber 41 and delivered to the raising and lowering pins 57a, the main arm A4 retracts from the pre-processing camber 41, and the raising and lowering pins 57a lower to mount the wafer W on the cooling plate 56. Thereafter or at the same time, the entrance shutter 47a is closed and the opening/closing valve V2 is opened and the exhaust pump 73a is driven to reduce the pressure in the pre-processing chamber 41 (to 0.1 atmospheric pressure or less), while the switch valve Va is operated based on the control signal from the control unit 70 to purge (replace) the He gas in the pre-processing chamber 41 to keep an atmosphere with a concentration of He gas of 90% or higher. Concurrently with the reduction in pressure in the pre-processing chamber 41 and the purge operation, the operation of cooling the wafer W by the cooling plate 56 is performed in parallel.

The wafer W which has been subjected to the cooling processing in the pre-processing chamber 41 is moved by rise of the raising and lowering pins 57a to above the cooling plate 56 and received by the transfer arm 45c entering the pre-processing chamber 41 via the transfer in/out port 43a having the shutter 44a being opened, and delivered to the spin chuck 50 in the treatment chamber 40. In this event, both the pre-processing chamber 41 and the treatment chamber 40 have a He gas concentration of 90% or higher and no pressure difference therebetween, causing no air turbulence. After the wafer W is held on the spin chuck 50, the shutter 44a is closed, and the thinner nozzle 53 discharges (supplies) the thinner onto the front surface of the wafer W on the spin chuck 50, and the coating solution supply nozzle 52 discharges (supplies) the resist solution to form a resist film on the wafer surface in the treatment chamber 40. Subsequently, the rinse nozzle 54 discharges (supplies) the rinse solution to the rim and rear surface of the wafer W to thereby perform rinse treatment on the rim and rear surface of the wafer W.

The wafer W on which the resist film has been formed in the treatment chamber 40 is received by the transfer arm 45c and transferred into the post-processing chamber 42 in the upper tier via the transfer in/out port 43b having the shutter 44b opened, and received by the raising and lowering pins 57b moving to above the heating plate 58. In this event, both the treatment chamber 40 and the post-processing chamber 42 have a He gas concentration of 90% or higher and no pressure difference therebetween, causing no air turbulence. After the wafer W is delivered to the raising and lowering pins 57b, the shutter 44b is closed, and the raising and lowering pins 57b lower to mount the wafer W on the heating plate 58 in the post-processing chamber 42. Thereafter or at the same time, the opening/closing valve V3 is opened and the exhaust pump 73b is driven to reduce the pressure in the post-processing chamber 42 (to 0.1 atmospheric pressure or less), while the switch valve Vb is operated to purge (replace) the He gas in the post-processing chamber 42 to keep an atmosphere with a concentration of He gas of 90% or higher. Concurrently with the reduction in pressure in the post-processing chamber 42 and the purge operation, the operation of heating the wafer W by the heating plate 58 is performed in parallel so that the heating plate 58 evaporates the thinner (solvent) from the resist film.

The wafer W which has been subjected to heating processing in the post-processing chamber 42 is moved to above the heating plate 58 by rise of the raising and lowering pins 57b, received by the main arm A4 entering the post-processing chamber 42 via the transfer-out port 46b having the exit shutter 47b opened, and transferred out from the post-processing chamber 42.

With the coating unit 32B of the second embodiment, the throughput can be improved and the resist film thickness can be made uniform as in the first embodiment. Further, in the coating unit 32B of the second embodiment, the pre-processing chamber 41 and the post-processing chamber 42 are arranged one on top of the other, so that their area on a plane can be reduced to reduce the size of the apparatus.

Third Embodiment

Figure 8:
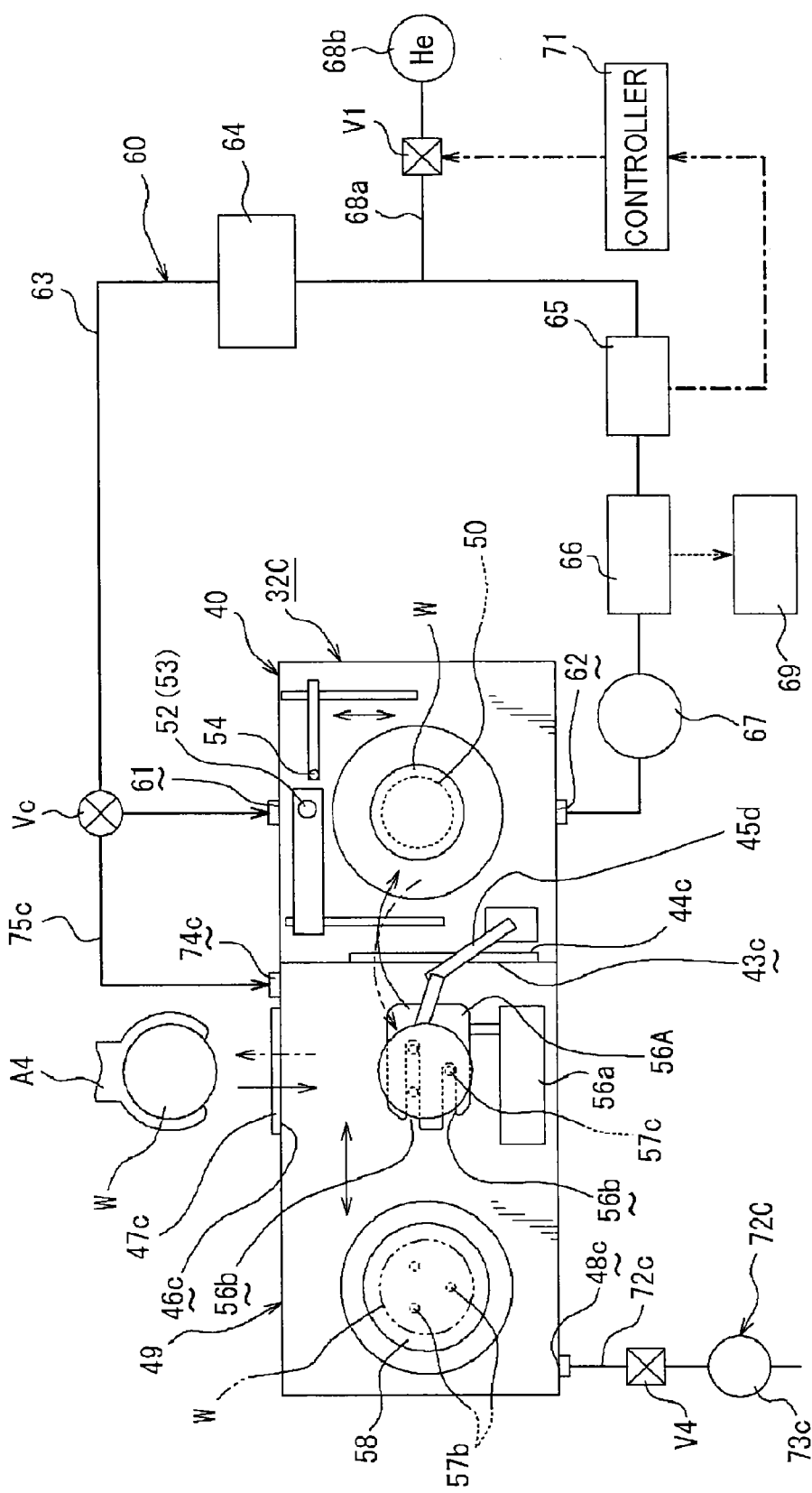
FIG. 8 is an explanatory view schematically showing, in a plan view, a third embodiment of the substrate processing apparatus according to the present invention.

FIG. 8 is a schematic sectional view showing a third embodiment of the substrate processing apparatus according to the present invention.

A coating unit 32C that is the substrate processing apparatus of the third embodiment is a case in which the treatment chamber 40 in the first embodiment is connected to a thermal processing chamber 49 housing a heating plate 58 and a cooling plate 56A. In this case, the thermal processing chamber 49 and the treatment chamber 40 are provided with a transfer in/out port 43c for the wafer W and a shutter 44c for opening/closing the transfer in/out port 43c. In one of the thermal processing chamber 49 and the treatment chamber 40, a transfer arm 45d is disposed for delivering the wafer W between the thermal processing chamber 49 and the treatment chamber 40.

In the thermal processing chamber 49, the heating plate 58 that is a heating means for heating the wafer W coated with the resist solution to a predetermined temperature (100° C.) and the cooling plate 56A that is a cooling means for cooling the wafer W before the resist solution is supplied to the wafer W to a predetermined temperature (23° C.) are housed. In this case, the cooling plate 56A is configured to be able to proceed and retract to/from the heating plate 58 by a moving mechanism 56a and to deliver the wafer W received from the main arm A4 or the transfer arm 45d to the heating plate 58 or to receive the wafer W from the heating plate 58.

On the side wall on the transfer region R4 side in the thermal processing chamber 49, a transfer in/out port 46c for the wafer W is provided, and a shutter 47c for opening/closing the transfer in/out port 46c is provided at the transfer in/out port 46c. Through the transfer in/out port 46c, the wafer W can be transferred by the main arm A4 to/from the thermal processing chamber 49 and then delivered or received to/from raising and lowering pins 57c.

Below the cooling plate 56A, three raising and lowering pins 57c projecting and retracting to/from above the cooling plate 56A via two slits 56b provided in the cooling plate 56A are provided to be able to rise and lower.

The thermal processing chamber 49 is also provided with an exhaust port 48c as in the pre-processing chamber 41 and the post-processing chamber 42, and a vacuum mechanism 72C is connected to the exhaust port 48c. In this case, the vacuum mechanism 72C is configured such that an exhaust pump 73c is connected via an opening/closing valve V4 to an exhaust pipe 72c connected to the exhaust port 48c. Further, the thermal processing chamber 49 is provided with a supply port 74c as in the pre-processing chamber 41 and the post-processing chamber 42, and a supply pipe 75c connected to the supply port 74c is connected to the gas supply mechanism 60 via a switch valve Vc provided on the supply side of the circulation pipe 63 of the gas supply mechanism 60.

Note that the other portions in the third embodiment are the same as those in the first embodiment, and therefore the same numerals are given to the same portions and the description thereof will be omitted.

An operation aspect of the third embodiment will be described below. First, the gas supply mechanism 60 is actuated to keep the inside of the treatment chamber 40 in an atmosphere with a concentration of He gas of 90% or higher in advance. In this state, the wafer W taken out from the shelf unit U5 as described above is transferred by the main arm A4 into the thermal processing chamber 49 and delivered to raising and lowering pins 57c, the main arm A4 then retracts from the thermal processing chamber 49, and the raising and lowering pins 57c lower to mount the wafer W on the cooling plate 56A. Thereafter or at the same time, the shutter 44c is closed and the opening/closing valve V4 is opened and the exhaust pump 73c is driven to reduce the pressure in the thermal processing chamber 49 (to 0.1 atmospheric pressure or less), while the switch valve Vc is operated based on the control signal from the control unit 70 to purge (replace) the He gas in the thermal processing chamber 49 to keep an atmosphere with a concentration of He gas of 90% or higher. Concurrently with the reduction in pressure in the thermal processing chamber 49 and the purge operation, the operation of cooling the wafer W by the cooling plate 56A is performed in parallel.

The wafer W which has been subjected to the cooling processing in the thermal processing chamber 49 is moved by rise of the raising and lowering pins 57c to above the cooling plate 56A and received by the transfer arm 45d entering the thermal processing chamber 49 via the transfer in/out port 43c having the shutter 44c being opened, and delivered to the spin chuck 50 in the treatment chamber 40. In this event, both the thermal processing chamber 49 and the treatment chamber 40 have a He gas concentration of 90% or higher and no pressure difference therebetween, causing no air turbulence. After the wafer W is held on the spin chuck 50, the shutter 44c is closed, and the thinner nozzle 53 discharges (supplies) the thinner onto the front surface of the wafer W on the spin chuck 50, and the coating solution supply nozzle 52 discharges (supplies) the resist solution to form a resist film on the wafer surface in the treatment chamber 40. Subsequently, the rinse nozzle 54 discharges (supplies) the rinse solution to the rim and rear surface of the wafer W to thereby perform rinse treatment on the rim and rear surface of the wafer W.

The wafer W on which the resist film has been formed in the treatment chamber 40 is received by the transfer arm 45d and transferred again into the thermal processing chamber 49 via the transfer in/out port 43c having the shutter 44c opened, and delivered to the raising and lowering pins 57c moving upward. In this event, both the treatment chamber 40 and the thermal processing chamber 49 have a He gas concentration of 90% or higher and no pressure difference therebetween, causing no air turbulence. After the wafer W is delivered to the raising and lowering pins 57c, the shutter 44c is closed, and the raising and lowering pins 57c lower to mount the wafer W on the cooling plate 56A in the thermal processing chamber 49. The cooling plate 56A moves while mounting the wafer W thereon and delivers the wafer W to the raising and lowering pins 57b of the heating plate 58. The raising and lowering pins 57b received the wafer W lower to mount the wafer W on the heating plate 58 so that the heating plate 58 heats the wafer W to evaporate the thinner (solvent) from the resist film. The wafer W which has been subjected to heating processing is moved to above the heating plate 58 by rise of the raising and lowering pins 57b, received again by the cooling plate 56A, and moved to the usual position of the cooling plate 56A. During this movement, the wafer W is cooled by the cooling plate 56A. The wafer W moved to the usual position of the cooling plate 56A is moved to above the cooling plate 56A by rise of the raising and lowering pins 57c, received by the main arm A4 entering the thermal processing chamber 49 via the transfer in/out port 46c having the shutter 47c opened, and transferred out from the thermal processing chamber 49.

In the coating unit 32C of the third embodiment, the thermal processing chamber 49 housing the cooling plate 56A and the heating plate 58 is adjacent to the treatment chamber 40 for performing coating treatment, so that the throughput can be further improved and the resist film thickness can be made uniform and the size of the apparatus can be reduced.

Fourth Embodiment

Figure 9:
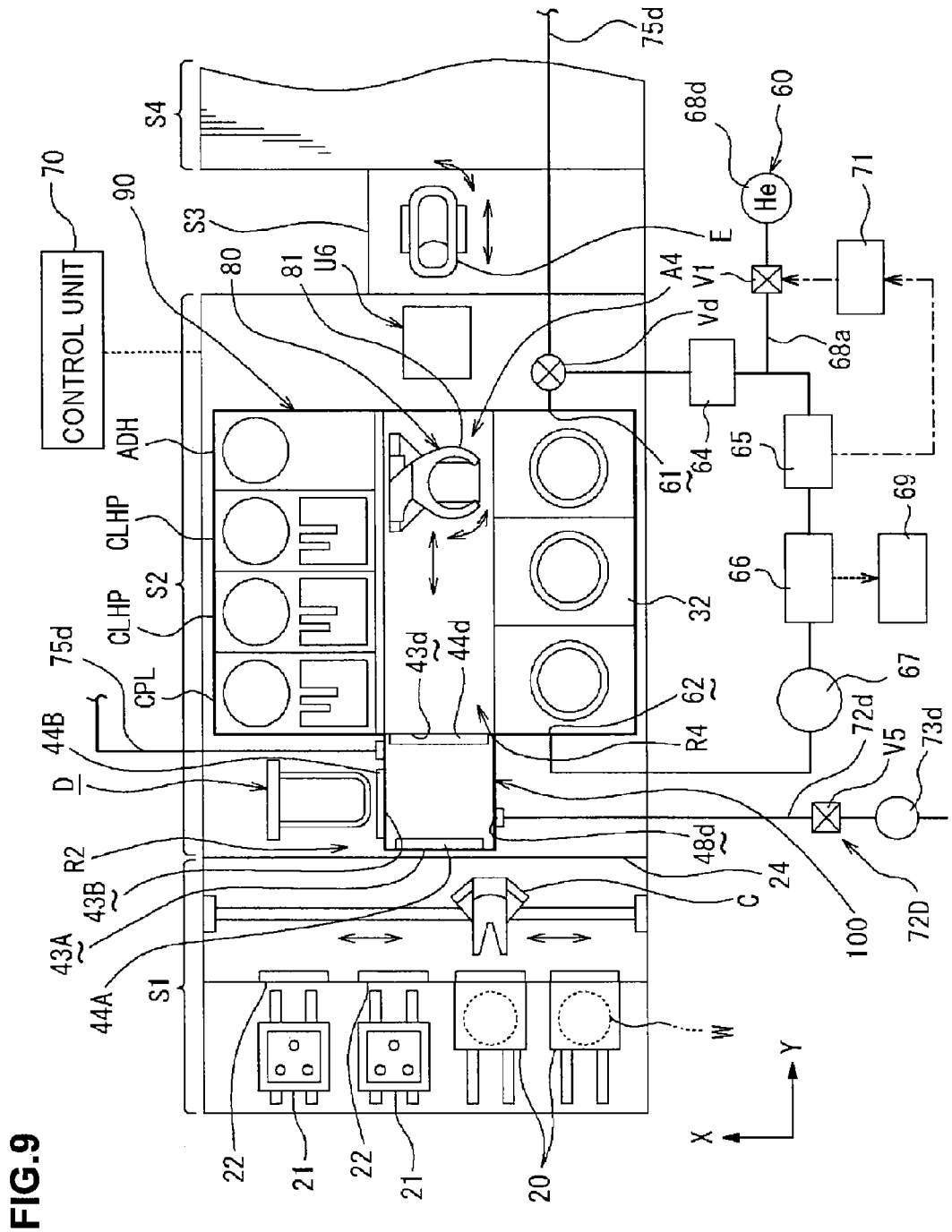
FIG. 9 is an explanatory view schematically showing, in a plan view, a fourth embodiment of the substrate processing apparatus according to the present invention.

FIG. 9 is a schematic sectional view showing a fourth embodiment of the substrate processing apparatus according to the present invention.

The substrate processing apparatus of the fourth embodiment is an example in which a region of the fourth unit block B4 (COT layer) including the coating unit 32 in the resist coating and developing treatment apparatus is bright into a He gas atmosphere. More specifically, this is an example in which all of the coating unit 32, the heating units (CLHP) housing the heating plates 58, the cooling units (CPL) housing the cooling plates 56, and the hydrophobic treatment units (ADH), the transfer region R4, and the main arm A4 movable in the transfer region R4 which constitute the fourth unit block B4 (COT layer) are arranged in an independent casing 90 partitioning them from the ambient air, that is, the first, second, third, and fifth unit blocks B1, B2, B3, and B5, and the independent casing 90 is kept in a He gas atmosphere, and a substrate housing chamber 100 for transferring in/out the wafer W constituting a part (the housing block 10c) of the shelf unit U5 is connected to the independent casing 90.

In this case, the substrate housing chamber 100 and the independent casing 90 are provided with a transfer in/out port 43d for the wafer W, and a shutter 44d for opening/closing the transfer in/out port 43d is provided at the transfer in/out port 43d.

To the independent casing 90, a gas supply mechanism 60 that is the same as that in the first embodiment is connected so that the He gas is kept at a predetermined concentration, for example, 90% or higher at all times. Since the gas supply mechanism 60 is the same as that in the first embodiment, the same numerals are given to the same portions, and description thereof will be omitted.

The substrate housing chamber 100 is provided with transfer in/out ports 43A and 43B for the wafer W, on a surface of the carrier block S1 side and a side surface adjacent thereto respectively and shutters 44A and 44B for opening/closing the transfer in/out ports 43A and 43B. The wafer W is transferred into/out from the substrate housing chamber 100 by the transfer arm C via the transfer in/out port 43A, and transferred into/out from the substrate housing chamber 100 by the transfer arm D via the transfer in/out port 43B.

The substrate housing chamber 100 is also provided with an exhaust port 48d as in the pre-processing chamber 41 and the post-processing chamber 42, and a vacuum mechanism 72D is connected to the exhaust port 48d. In this example, the vacuum mechanism 72D is configured such that an exhaust pump 73d is connected via an opening/closing valve V5 to an exhaust pipe 72d connected to the exhaust port 48d. Further, the substrate housing chamber 100 is provided with a supply port 74d as in the pre-processing chamber 41 and the post-processing chamber 42, and a supply pipe 75d connected to the supply port 74d is connected to the gas supply mechanism 60 via a switch valve Vd provided on the supply side of the circulation pipe 63 of the gas supply mechanism 60.

Note that the other portions in the fourth embodiment are the same as those in the first embodiment, and therefore the same numerals are given to the same portions and the description thereof will be omitted.

An operation aspect of the fourth embodiment will be described below. First, the gas supply mechanism 60 is actuated to keep the inside of the independent chamber 90 in an atmosphere with a concentration of He gas of 90% or higher in advance. In this state, the wafer W is transferred by the transfer arm C into the substrate housing chamber 100, and the transfer arm C then retracts from the substrate housing chamber 100. Thereafter or at the same time, the shutter 44A is closed and the opening/closing valve V5 is opened and the exhaust pump 73d is driven to reduce the pressure in the substrate housing chamber 100 (to 0.1 atmospheric pressure or less), while the switch valve Vd is operated to purge (replace) the He gas in the substrate housing chamber 100 to keep an atmosphere with a concentration of He gas of 90% or higher.

Next, the shutter 44d is opened, and the main transfer arm A4 transfers the wafer W in the substrate housing chamber 100 via the transfer in/out port 43d to the cooling unit (CPL) in the independent casing 90, and the wafer W is adjusted to a predetermined temperature (23° C.) by the cooling plate 56 in the cooling unit (CPL). The wafer W which has been cooled by cooling unit (CPL) is transferred by the main arm A4 to the hydrophobic treatment unit (ADH) and subjected to hydrophobic treatment, and transferred again to the cooling unit (CPL) and adjusted to a predetermined temperature. Next, the wafer W taken out by the main arm A4 from the cooling unit (CPL) is transferred to the coating unit 32 where a resist film is formed on the wafer W. In this event, all of the units in the independent casing 90 have a He gas concentration of 90% or higher and no pressure difference therebetween, causing no air turbulence. During the resist coating treatment, since an atmosphere with a concentration of the He gas of 90% or higher having a high kinematic viscosity coefficient is kept in the coating unit 32, drying of the resist solution on the outer periphery side where the circumferential speed is higher than that on the rotation center side of the wafer W can be made slower. This can make the film thickness of the resist film to be formed on the wafer surface uniform.

The wafer W on which the resist film has been formed is transferred by the main arm A4 to the heating unit (CLHP) and subjected to pre-baking for evaporation of the solvent from the resist film by the heating plate 58. Thereafter, the wafer W is housed by the main arm A4 into the substrate housing chamber 100 and temporarily waits there, and is then subjected to exposure processing and then developing treatment in processes similar to those described above.

Other Embodiments

Though a case in which the substrate processing apparatus according to the present invention is applied to the resist coating and developing treatment apparatus for a semiconductor wafer has been described in the above embodiments, the substrate processing apparatus according to the present invention is also applicable to a resist coating and developing treatment apparatus for an LCD glass substrate.

What is claimed is:
1. A substrate processing apparatus, comprising:
a holder for rotatably holding a substrate to be processed;
a coating solution supply nozzle for supplying a coating solution onto a front surface of the substrate to be processed held by said holder;
a treatment chamber housing said holder and said coating solution supply nozzle;
a cooling device which cools the substrate to be processed before the coating solution is supplied to the substrate to be processed, to a predetermined temperature;
a heating device that heats the substrate to be processed coated with the coating solution to a predetermined temperature; and
a transferer that transfers the substrate to be processed between said treatment chamber, said cooling device and said heating device,
a pre-processing chamber housing said cooling device and a post-processing chamber housing said heating device, said pre-processing and post-processing chambers being connected to said treatment chamber via transfer in/out ports for the substrate to be processed, one transfer in/out port is located between the pre-processing chamber and the treatment chamber, and another transfer in/out port is located between the post-processing chamber and the treatment chamber, wherein said treatment chamber, said cooling device and said heating device are partitioned from an ambient air, wherein said treatment chamber, said pre-processing chamber, and said post-processing chamber are connected to a single gas supply mechanism having a supply source of a gas having a kinematic viscosity coefficient higher than that of air and kept at a predetermined concentration of the gas to maintain uniform pressure between said treatment chamber, said pre-processing chamber, and said post-processing chamber, and wherein the gas is a helium gas, and the predetermined concentration is 90% or higher.

2. A substrate processing apparatus comprising:

a holder for rotatably holding a substrate to be processed;

a coating solution supply nozzle for supplying a coating solution onto a front surface of the substrate to be processed held by said holder;

a treatment chamber housing said holder and said coating solution supply nozzle;

a cooling device which cools the substrate to be processed before the coating solution is supplied to the substrate to be processed, to a predetermined temperature;

a heating device that heats the substrate to be processed coated with the coating solution to a predetermined temperature;

a transferer that transfers the substrate to be processed between said treatment chamber, said cooling device and said heating device; and a pre-processing chamber housing said cooling device and a post-processing chamber housing said heating device, said pre-processing and post-processing chambers being connected to said treatment chamber via transfer in/out ports for the substrate to be processed, one transfer in/out port is located between the pre-processing chamber and the treatment chamber, and another transfer in/out port is located between the post-processing chamber and the treatment chamber, wherein said treatment chamber, said cooling device and said heating device are partitioned from an ambient air, wherein said treatment chamber, said pre-processing chamber, and said post-processing chamber are connected to a single gas supply mechanism having a supply source of a gas having a kinematic viscosity coefficient higher than that of air and kept at a predetermined concentration of the gas to maintain uniform pressure between said treatment chamber, said pre-processing chamber, and said post-processing chamber, and wherein shutters capable of opening/closing the transfer in/out ports are provided at the transfer in/out ports, and a transfer arm for delivering the substrate to be processed between said treatment chamber, said pre-processing chamber and said post-processing chamber is provided in one of said treatment chamber, said pre-processing chamber and said post-processing chamber.

3. A substrate processing apparatus comprising:

a holder for rotatably holding a substrate to be processed;

a coating solution supply nozzle for supplying a coating solution onto a front surface of the substrate to be processed held by said holder; a treatment chamber housing said holder and said coating solution supply nozzle;

a cooling device which cools the substrate to be processed before the coating solution is supplied to the substrate to be processed, to a predetermined temperature;

a heating device which heats the substrate to be processed coated with the coating solution to a predetermined temperature;

a transferer that transfers the substrate to be processed between said treatment chamber, said cooling device and said heating device; and a thermal processing chamber housing said cooling device and said heating device, said thermal processing chamber being connected to said treatment chamber via a transfer in/out port, located between the thermal processing chamber and the treatment chamber, for the substrate to be processed, wherein a shutter capable of opening/closing the transfer in/out port is provided at the transfer in/out port, and a transfer arm for delivering the substrate to be processed between said treatment chamber and said thermal processing chamber is provided in one of said treatment chamber and said thermal processing chamber, wherein said treatment chamber, said cooling device and said heating device are partitioned from an ambient air, and wherein said treatment chamber and said thermal processing chamber are connected to a single gas supply mechanism having a supply source of a gas having a kinematic viscosity coefficient higher than that of air and kept at a predetermined concentration of the gas to maintain uniform pressure between said treatment chamber and said thermal processing chamber.

4. The substrate processing apparatus as set forth in claim 2, wherein a vacuum mechanism for bringing an inside of said pre-processing chamber into a vacuum state and said gas supply mechanism having said gas supply source for replacing the inside of said pre-processing chamber with the gas having a kinematic viscosity coefficient higher than that of air are connected to said pre-processing chamber to keep gas concentrations in said pre-processing chamber and said treatment chamber equal at least when the substrate to be processed is transferred from said pre-processing chamber to said treatment chamber.

5. The substrate processing apparatus as set forth in claim 4, wherein a vacuum mechanism for bringing an inside of said post-processing chamber into a vacuum state and said gas supply mechanism having said gas supply source for replacing the inside of said post-processing chamber with the gas having a kinematic viscosity coefficient higher than that of air are connected to said post-processing chamber to keep gas concentrations in said treatment chamber and said post-processing chamber equal at least when the substrate to be processed is transferred from said treatment chamber to said post-processing chamber.

6. The substrate processing apparatus as set forth in claim 3, wherein a vacuum mechanism for bringing an inside of said thermal processing chamber into a vacuum state and said gas supply mechanism having said gas supply source for replacing the inside of said thermal processing chamber with the gas having a kinematic viscosity coefficient higher than that of air are connected to said thermal processing chamber to keep gas concentrations in said treatment chamber and said thermal processing chamber equal at least when the substrate to be processed is transferred from said treatment chamber to said thermal processing chamber or transferred from said thermal processing chamber to said treatment chamber.

7. The substrate processing apparatus as set forth in claim 1, wherein the treatment chamber is located between the pre-processing chamber and the post-processing chamber.

8. The substrate processing apparatus as set forth in claim 1, wherein the treatment chamber includes the coating solution supply nozzle and a thinner nozzle.

9. The substrate processing apparatus as set forth in claim 1, wherein
a first vacuum mechanism and said gas supply mechanism are connected to said pre-processing chamber,
a second vacuum mechanism and said gas supply mechanism are connected to said post-processing chamber, and
said first vacuum mechanism, said second vacuum mechanism, and said gas supply mechanism control the pressure within said treatment chamber, said pre-processing chamber, and said post-processing chamber to maintain the uniform pressure between said treatment chamber, said pre-processing chamber, and said post-processing chamber.

* * * * *